(12) United States Patent
Kobayashi et al.

(10) Patent No.: US 7,573,119 B2
(45) Date of Patent: Aug. 11, 2009

(54) SEMICONDUCTOR DEVICE

(75) Inventors: Tomonaga Kobayashi, Fujimi (JP);
Yuzo Takita, Matsumoto (JP)

(73) Assignee: Seiko Epson Corporation (JP)

( * ) Notice: Subject to any disclaimer, the term of this patent is extended or adjusted under 35 U.S.C. 154(b) by 77 days.

(21) Appl. No.: 11/483,695

(22) Filed: Jul. 10, 2006

(65) Prior Publication Data

US 2007/0013062 A1 Jan. 18, 2007

(30) Foreign Application Priority Data

Jul. 13, 2005 (JP) .............................. 2005-204231
Mar. 10, 2006 (JP) .............................. 2006-065482

(51) Int. Cl.
*H01L 29/00* (2006.01)
*H01L 23/34* (2006.01)

(52) U.S. Cl. ................ 257/531; 257/724; 257/E23.151

(58) Field of Classification Search ................ 257/531, 257/724, E23.151
See application file for complete search history.

(56) References Cited

U.S. PATENT DOCUMENTS

| | | | |
|---|---|---|---|
| 5,514,832 A * | 5/1996 | Dusablon et al. ........... 174/15.1 |
| 6,287,931 B1 | 9/2001 | Chen | |
| 6,303,971 B1 * | 10/2001 | Rhee .......................... 257/531 |
| 6,727,572 B2 * | 4/2004 | Maeda et al. ............... 257/531 |
| 6,790,751 B2 | 9/2004 | Tsuruta et al. | |
| 7,064,645 B2 | 6/2006 | Kobayashi et al. | |
| 2003/0102521 A1 * | 6/2003 | Maeda et al. ............... 257/531 |

FOREIGN PATENT DOCUMENTS

| | | |
|---|---|---|
| CN | 1431709 | 7/2003 |
| JP | 08-147351 | 6/1996 |
| JP | 2000-323656 | 11/2000 |
| JP | 2003-179148 | 6/2003 |
| JP | 3509352 | 1/2004 |
| JP | 3509362 | 1/2004 |
| KR | 0167392 | 9/1998 |

* cited by examiner

*Primary Examiner*—Nitin Parekh
(74) *Attorney, Agent, or Firm*—Harness, Dickey & Pierce, P.L.C.

(57) ABSTRACT

A semiconductor device includes: a semiconductor substrate having a first face in which a hole is formed; an insulating section made of an insulating material, the insulating material accommodated in the hole; and a wire having a turning pattern and arranged on the insulating section.

7 Claims, 5 Drawing Sheets

SEMICONDUCTOR DEVICE

CROSS-REFERENCE TO RELATED APPLICATION

This application claims priority to Japanese Patent Application No. 2005-204231, filed Jul. 13, 2005, and Japanese Patent Application No. 2006-065482, filed Mar. 10, 2006, the contents of which are incorporated herein by reference.

BACKGROUND

1. Technical Field

The present invention relates to a semiconductor device which includes a wire having turning pattern.

2. Related Art

Recently, there is a noticeable proliferation of various types of portable electronic apparatuses such as portable mobile information terminals. In view of technological tendencies to demand increased portability and higher performance in such electronic apparatuses, semiconductor devices packaged in these electronic apparatuses are desired to be made even smaller, lighter, and thinner. One conventional package structure (sealing structure) for semiconductor devices which addresses such tendencies and desires is a chip size package whose external size can be made almost the same as that of a semiconductor substrate (semiconductor chip) on which an integrated circuit is formed.

As electronic apparatuses are being made smaller, there are demands to integrate high-performance capacitors and inductors in semiconductor devices. Many inductors formed on semiconductor substrates have a spiral shape. The Q-value (the ratio between inductance and resistance) is one parameter which indicates the performance of an inductor.

Since the Q-value decreases when a multiple-turn inductor such as a spiral inductor is used in a semiconductor device, various types of conventional structures have been produced to counter this (e.g., see Japanese Unexamined Patent Application, First Publication No. 2000-323656 and Japanese Patent No. 3509362). In a semiconductor device described in JP 2000-323656, an insulating film, a spiral inductor, and an insulating layer are formed sequentially on a semiconductor substrate, and a soft magnetic thin-film is multilayered over the insulating film. This configuration maintains a large relative magnetic permeability and obtains high inductance.

In a semiconductor device described in JP 3509362, metal wires of a spiral inductor are provided on a plurality of polyimide resin columns formed on a semiconductor substrate. Since this obtains a hollow section between the semiconductor substrate and the spiral inductor, the relative permittivity (relative dielectric constant) is low, enhancing the characteristics of the inductor.

However, while the semiconductor device of JP 2000-323656 uses a magnetic thin-film to enhance the characteristics of the inductor, there is concern over increasing costs of this technology. While the semiconductor device of JP 3509362 enhances the inductor characteristics by arranging the spiral inductor over the resin columns, the configuration is unstable and does not easily remain strong. This makes it difficult to package the semiconductor device in external apparatuses, and, since it is also difficult to maintain long-term reliability, its application is limited.

SUMMARY

An advantage of some aspects of the invention is to provide a semiconductor device which keeps costs low, has excellent strength and reliability, and can obtain a high Q-value.

A semiconductor device according to an aspect of the invention includes: a semiconductor substrate having a first face in which a hole is formed; an insulating section made of an insulating material, the insulating material accommodated in the hole; and a wire having a turning pattern and arranged on the insulating section.

In this semiconductor device, when a current is supplied to the wire, a magnetic field is generated in the thickness direction of the semiconductor substrate. In conventional semiconductor devices, an induced current (eddy current) is induced in a plane perpendicular to this magnetic field. Since this induced current is generated in a direction which cancels a magnetic flux caused by a signal current flowing along the wire, it reduces the inductance component and lowers the Q-value. In contrast in the semiconductor device according to the aspect of the invention, an insulating section creates a distance between the wire on the insulating section and the semiconductor substrate. Using this insulating material enables the cost to be reduced while suppressing eddy current. Electromagnetic coupling between the wire and circuits and the like formed on the semiconductor substrate can also be suppressed, and the Q-value of the wire can be increased.

Another problem of a conventional semiconductor device which includes an insulating film formed on a semiconductor substrate is that, when the semiconductor device is packaged in an external apparatus or the like, stress is applied to the insulating film and causes it to peel away. In contrast, in the semiconductor device according to the aspect of the invention, there is close contact between the semiconductor substrate and the insulating material which is accommodated in the hole of the semiconductor substrate. This achieves an anchor effect between the semiconductor substrate and the insulating section, making it possible to increase the bonding strength and obtain a semiconductor device with excellent reliability.

Preferably in this semiconductor device, the wire has a spiral pattern or a toroidal pattern. By using the wire having a toroidal pattern, the inductance value (L-value) can be increased with a small occupied area.

It is preferable that this semiconductor device further include a stress-relaxation layer formed on the wire. When this semiconductor device is packaged in an external apparatus or the like, any impact against the wire and the semiconductor substrate can be absorbed by the stress-relaxation layer. Even if an active element is arranged on the semiconductor substrate, an impact on the wire can be prevented from being directly transmitted to the active element, and impact on the active element can be relieved. As a result, it becomes possible to suppress the load on the active element, and to reduce the size of the semiconductor device.

Preferably in this semiconductor device, the depth of the hole is equal to or more than 5 μm. In this semiconductor device, if the wire is too close to the semiconductor substrate, the magnetic field of the wire affects circuits and the like formed on the semiconductor substrate. The inventors measured electromagnetic coupling in the distance between the wire and the semiconductor substrate, and discovered that electromagnetic coupling is generated at a distance of less than 5 μm. By keeping the distance between the wire and the semiconductor substrate at 5 μm or more, that is, by making the depth of the hole equal to or more than 5 μm, the effects of the wire on the semiconductor substrate can be remarkably suppressed.

Preferably in this semiconductor device, the relative permittivity (relative dielectric constant) of the insulating material is equal to or less than 10. When an insulating material with a high relative permittivity is used in this semiconductor device, dielectric loss occurs in the wire. The inventors measured dielectric loss at various relative permittivities of insulating materials, and confirmed that dielectric loss increases when the relative permittivity of the insulating material is equal to or more than 10. By making the relative permittivity of the insulating material equal to or less than to 10, dielectric loss of the wire can be reduced and the Q-value can be increased.

Preferably in this semiconductor device, the hole is formed in all regions surrounded by an outermost turn of the wire. That is, the hole is preferably formed in a region of the first face of the semiconductor substrate, the region surrounding the turning pattern of the wire.

When this semiconductor device includes an electrode penetrating the semiconductor substrate, the first face may be on a side opposite to an active face of the semiconductor substrate, and the wire and the electrode may be electrically connected on the first face. According to this configuration, an antenna or an inductor using the wire can be formed on a single chip. Since the hole and the wire is provided by processing a side of the semiconductor substrate which is opposite to its active face, a high-performance inductor or antenna and the like can be incorporated in an IC without changing the package area of the IC.

This semiconductor device may further includes an external connection terminal formed on the active face and electrically connected to the electrode on the active face. According to this configuration, the semiconductor device can be configured in a flip-chip package wherein the inductor or the antenna are arranged on a chip face on an opposite side to the packaging face, obtaining a configuration which is effective for functions of transmitting/receiving.

DESCRIPTION OF EXEMPLARY EMBODIMENTS

First Embodiment of Semiconductor Device

A first embodiment of a semiconductor device 1 of the invention will be explained with reference to FIGS. 1 and 2.

Figure 1:
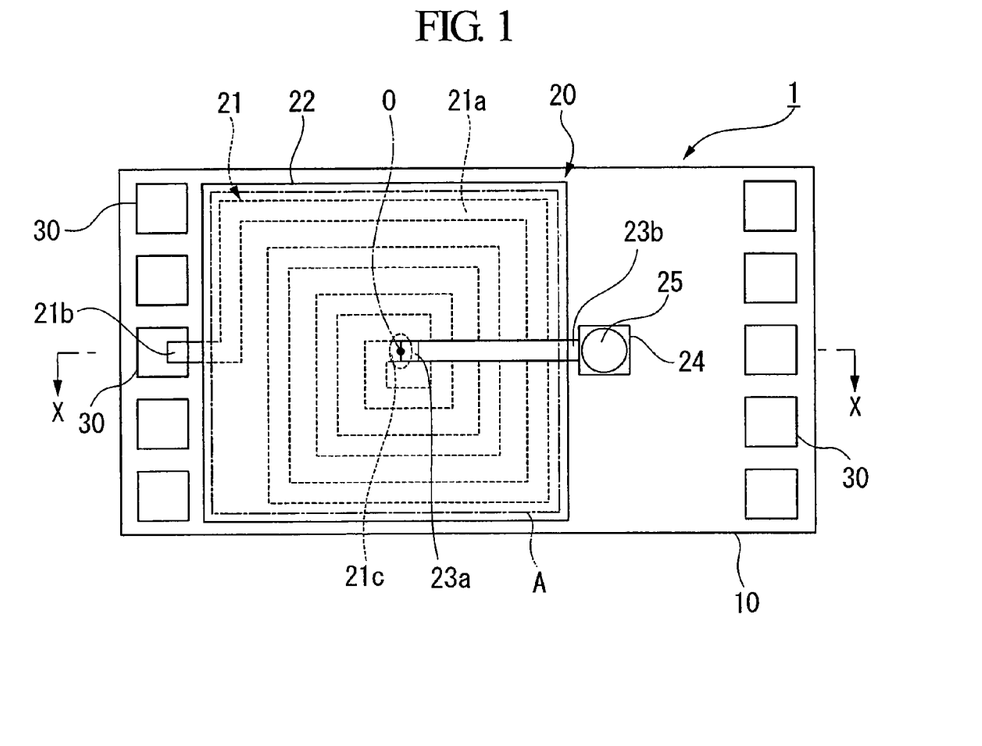
FIG. 1 is a plan view of a semiconductor device according to a first embodiment of the invention.

As shown in FIG. 1, the semiconductor device 1 according to the invention includes a silicon substrate (semiconductor substrate) 10, a wire section 20 provided on the silicon substrate 10, and electrodes 30 provided in peripheral parts of the silicon substrate 10.

Figure 2:
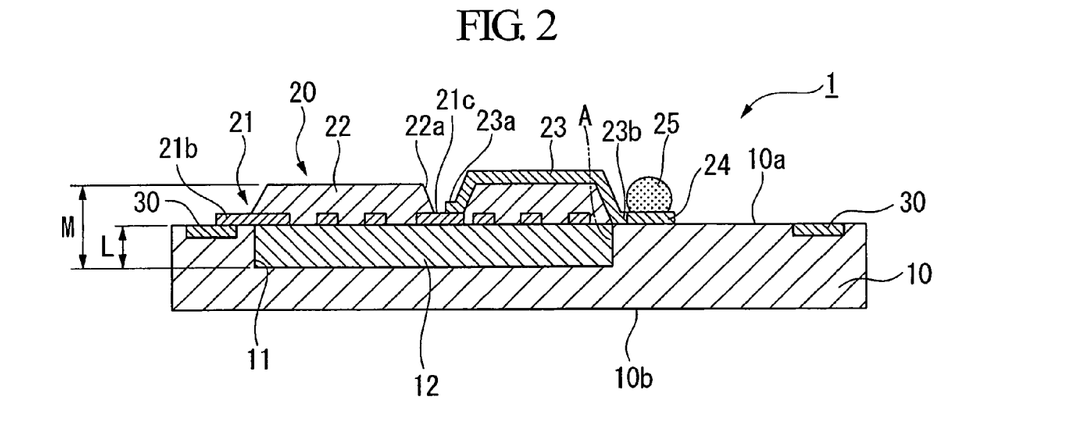
FIG. 2 is a cross-sectional view taken along the line X-X of the semiconductor device of FIG. 1.

As shown in FIG. 2, a removed region 11 (hole) is formed in a first face 10a of the silicon substrate 10 by partially removing one region in the thickness direction. This removed region 11 is filled with an insulating material to form an insulating section 12.

The wire section 20 includes a square-shaped spiral inductor (wire) 21 which is formed over the insulating section 12, and an insulating layer (stress-relaxation layer) 22 which is provided over the inductor 21.

The removed region 11 (hole) is formed in the thickness direction of the silicon substrate 10 in a region surrounded by the inductor 21 at a position corresponding to the inductor 21. That is, as shown in FIG. 1, the removed region 11 is formed in the thickness direction of the silicon substrate 10 in a region A which is most surrounded by an outer side wire 21a of the inductor 21. The depth L of the removed region 11 is preferably equal to or more than 5 µm. For example, the depth L of the removed region (hole) 11 can be substantially 5, 6, 7, 8, 9, 10, 11, 12, 13, 14, 15, 16, 17, 18, or 19 µm. The combined thickness M of the insulating section 12 and the insulating layer 22 is preferably equal to or less than 20 µm. For example, the combined thickness M can be substantially 6, 7, 8, 9, 10, 11, 12, 13, 14, 15, 16, 17, 18, 19, 20 µm. This configuration greatly suppresses the effect of the inductor 21 on the silicon substrate 10.

To form the removed region 11, a photoresist is arranged as a mask on the first face 10a of the silicon substrate 10 and one part of the silicon substrate 10 (the region A which is most surrounded by the outer side wire 21a of the inductor 21) is removed by dry etching. In this manner, the removed region 11 (hole) extending from the first face 10a of the silicon substrate 10 to a second face 10b.

There is no limitation on using a photoresist as the mask; for example, a film of $SiO_2$ may be used as a hard mask, or a photoresist and a hard mask may be used together. The etching method is not limited to dry etching, it being acceptable to use wet etching, laser processing, or both of these.

The removed region 11 is filled with an insulating material by a method such as droplet discharging (inkjet method) or spin coating.

To form the insulating section 12 and the insulating layer 22, this embodiment uses an insulating material such as polyimide resin, silicone-modified polyimide resin, epoxy resin, silicone-modified epoxy resin, acrylic resin, phenol resin, benzocyclobutene (BCB), polybenzoxazole (PBO), an inorganic material such as silicon oxide, and so on. This can reduce the dielectric loss of the inductor 21 and increase its Q-value.

The inductor 21 is arranged on the insulating section 12 and has multiple turns. The inductor 21 is formed in a spiral shape having a predetermined width, predetermined intervals, and a predetermined number of windings. A material such as gold (Au), copper (Cu), argon (Ag), titanium (Ti), tungsten (W), titanium tungsten (TiW), titanium nitride (TiN), nickel (Ni), nickel vanadium (NiV), chrome (Cr), aluminum (Al), and palladium (Pd), is used for the inductor 21.

The inductor 21 will be explained in detail. In FIG. 1, one end 21b (first end) of the inductor 21 is electrically connected to the electrodes 30. The inductor 21 has a spiral shape extending from its peripheral sections toward its center. Another end 21c (second end) of the inductor 21 is positioned in a center O of the spiral pattern. As shown in FIG. 2, a through-hole 22a is provided in the insulating layer 22 at a position corresponding to the second end 21c of the inductor 21. This through-hole 22a exposes the second end 21c of the inductor 21. A leading line 23 is connected to the inductor 21. One end 23a of the leading line 23 is electrically connected to the second end 21c of the inductor 21 inside the through-hole 22a. An external electrode 24 is connected to another end 23b of the leading line 23, and can be connected to external apparatuses and the like. A bump 25 of Pb-free solder or the like is formed on the external electrode 24. The semiconductor device 1 is electrically connected via the bump 25 to a printed wiring board (not shown).

The inductor 21 and the leading line 23 can be formed by conventional methods such as sputtering, photolithography and electrolytic plating, or photolithography and etching. For example, the inductor 21 and the leading line 23 can be formed by forming a spiral opening pattern on the insulating section 12 and coating this opening pattern with a conductive fluid by droplet discharge (inkjet method).

Subsequently, effects of the semiconductor device 1 according to the embodiment configured as above will be explained.

When an electrical current is supplied to the spiral inductor 21, a magnetic field is generated in the thickness direction of the silicon substrate 10. In a conventional semiconductor device with no insulating section 12 formed on the silicon substrate 10, generation of the magnetic field at this time induces an eddy current in the region surrounded by the inductor 21. In the semiconductor device 1 of this embodiment, generation of a magnetic field is suppressed by providing the removed region 11 in the silicon substrate 10 and filling it with an insulating material.

According to the semiconductor device of this embodiment, since the removed region 11 (the region in the thickness direction of the silicon substrate 10 corresponding to the inductor 21) is filled with an insulating material, the insulating section 12 is arranged between the inductor 21 and the silicon substrate 10 and creates an actual distance between the inductor 21 and the silicon substrate 10. By using an insulating material, the cost can be reduced and eddy current can be suppressed. Electromagnetic coupling between the inductor 21 and circuits and the like provided on the silicon substrate 10 can also be suppressed, and the Q-value of the inductor 21 can be increased. Due to the insulating layer 22 being provided on the inductor 21, even if an external force acts on the inductor 21 when the semiconductor device 1 is packaged in external apparatuses and the like, the insulating layer 22 functions as a stress-relaxation layer and reduces the force acting on the inductor 21.

Second Embodiment of Semiconductor Device

Figure 3:
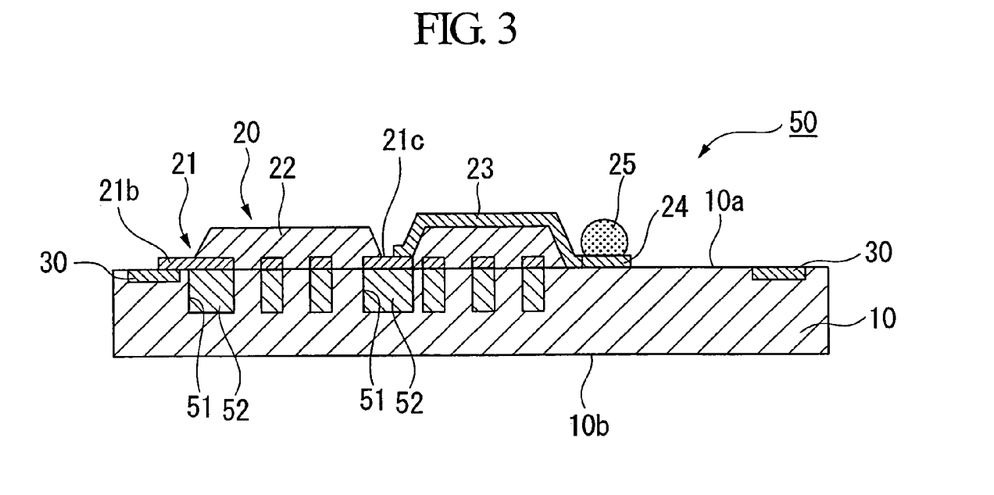
FIG. 3 is a cross-sectional view of a semiconductor device according to a second embodiment of the invention.

Subsequently, a second embodiment of the invention will be explained with reference to FIG. 3. In each of the embodiments of the invention described below, like parts to those in the configuration of the semiconductor device 1 according to the first embodiment are designated with like reference numerals and are not repetitiously explained.

While in the first embodiment, the removed region 11 is provided in the region A surrounded by the inductor 21, in a semiconductor device 50 according to the second embodiment, a removed region 51 (hole) is provided along the pattern of the inductor 21. For example, the shape of the removed region (hole) 51 has a turning pattern, ring pattern, and/or spiral pattern.

The removed region 51 may be formed by removing at least one part of the first face 10a of the silicon substrate 10 in its thickness direction. In this embodiment, the removed region 51 is formed only in a region which corresponds to the pattern of the inductor 21. As in the first embodiment, the removed region 51 is formed in correspondence with the pattern of the inductor 21, and filled with an insulating material to form an insulating section 52. The spiral inductor 21 is provided over the insulating section 52 to obtain the semiconductor device 50 shown in FIG. 3.

Subsequently, effects of the semiconductor device 50 according to the embodiment configured as above will be explained.

When an electrical current is supplied to the spiral inductor 21, a magnetic field is generated in the thickness direction of the silicon substrate 10. At this time, since the insulating section 52 is formed only in the region corresponding to the pattern of the inductor 21, the magnetic field generated by the inductor 21 has comparatively little effect on circuits and the like formed on the silicon substrate 10.

According to the semiconductor device 50 of this embodiment, since the insulating section 52 is formed along the pattern of the inductor 21, it becomes possible to suppress effects of the magnetic field of the spiral inductor 21, which is provided over the insulating section 52, on circuits and the like formed on the silicon substrate 10. This can prevent a reduction in the Q-value. Furthermore, the close contact between the silicon substrate 10 and the insulating material which the removed region 51 is filled with achieves an anchor effect between the silicon substrate 10 and the insulating section 52, whereby the bonding strength can be increased.

Third Embodiment of Semiconductor Device

Subsequently, a third embodiment of the invention will be explained with reference to FIGS. 4 and 5.

While the first embodiment uses the spiral inductor 21 as a wire, a semiconductor device 60 according to a third embodiment differs in that a toroidal inductor 61 is used as a wire.

Figure 4:
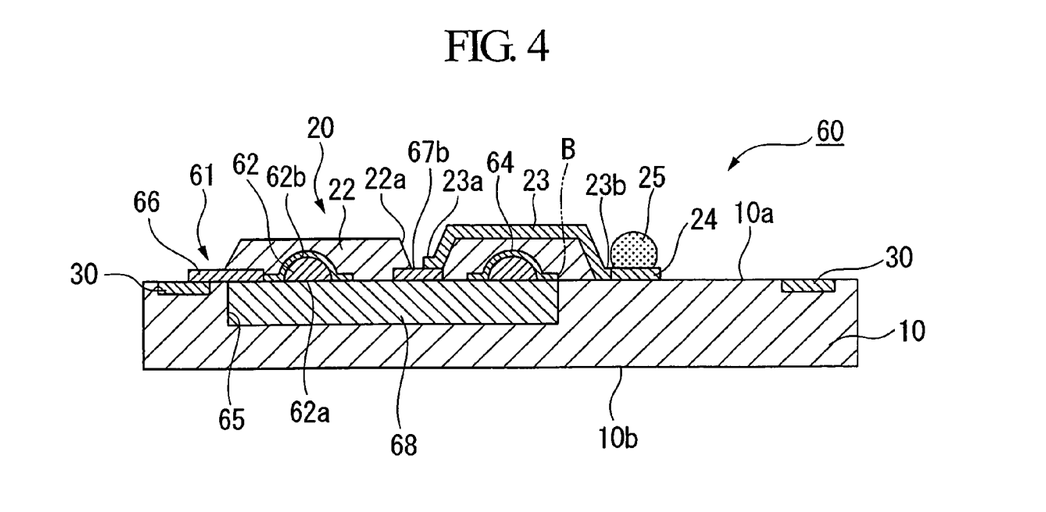
FIG. 4 is a cross-sectional view of a semiconductor device according to a third embodiment of the invention.
Figure 5:
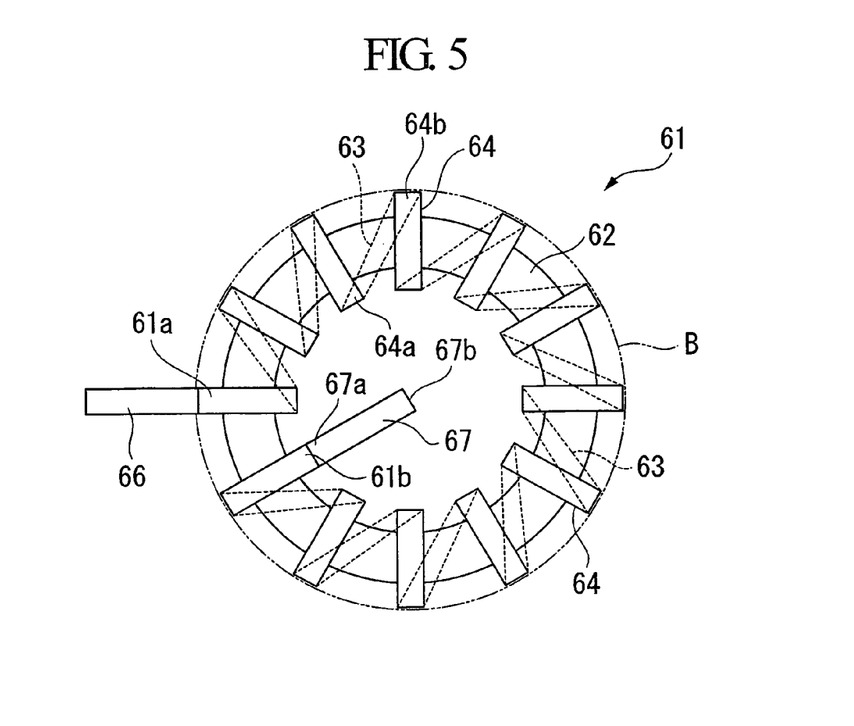
FIG. 5 is a plan view of an inductor of the semiconductor device according to the third embodiment of the invention.

As shown in FIGS. 4 and 5, the inductor 61 is wound in one direction (winding to the right in this embodiment) around a ring-shaped core member 62 which is provided on an insulating section 68. The inductor 61 includes lower inductors 63 formed over a bottom face 62a of the core member 62, and upper inductors 64 arranged in a radial shape from the center of the core member 62. As shown in FIG. 5, the lower inductors 63 incline such that one end 64a of one upper inductor 64 connects to another end 64b of a different upper inductor 64 which is adjacent thereto. That is, each lower inductor 63 is inclined in a circumferential direction from the diameter direction, leading from the inner side of the diameter direction toward the outer side. Each lower inductor 63 connects an end 64a of the diameter direction inner side of one upper inductor 64 to an end 64b of the diameter direction outer side of a different upper inductor 64 which is adjacent thereto.

A first wire pattern 66 is provided at one end 61a of the inductor 61 provided on the outside, and electrically connects the inductor 61 to the electrodes 30. A second wire pattern 67 is provided at another end 61b of the inductor 61 provided on the inside. One end 67a of the second wire pattern 67 is electrically connected to the inductor 61. As shown in FIG. 4, another end 67b of the second wire pattern 67 is exposed through a through-hole 22a and electrically connected to a leading line 23.

As shown in FIG. 5, a removed region 65 is provided in the thickness direction of the silicon substrate 10 in a region B which includes the regions for forming the inductor 61 and the core member 62. The removed region 65 is filled with an insulating material to obtain an insulating section 68.

Subsequently, effects of the semiconductor device 60 according to this embodiment configured in this manner will be explained.

When an electrical current is supplied to the toroidal inductor 61, a magnetic field is generated in the thickness direction of the silicon substrate 10. At this time, since the insulating section 68 is formed in the region B which includes the regions for forming the inductor 61 and the core member 62, the magnetic field generated by the inductor 61 has comparatively little effect on circuits and the like formed on the silicon substrate 10.

According to the semiconductor device 60 of this embodiment, since the removed region 65 corresponding to the inductor 61 is filled with an insulating material, a substantial distance can be created between the silicon substrate 10 and the inductor 61 provided on the insulating section 68. Therefore, electromagnetic coupling between the inductor 61 and circuits and the like provided on the silicon substrate 10 can be suppressed. By using the toroidal inductor 61, the inductance value (L-value) can be increased with a small occupied area.

Fourth Embodiment of Semiconductor Device

Subsequently, a fourth embodiment of a semiconductor device according to the invention will be explained with reference to FIGS. 7A and 7B, and FIGS. 8A to 8D.

Figure 7A:
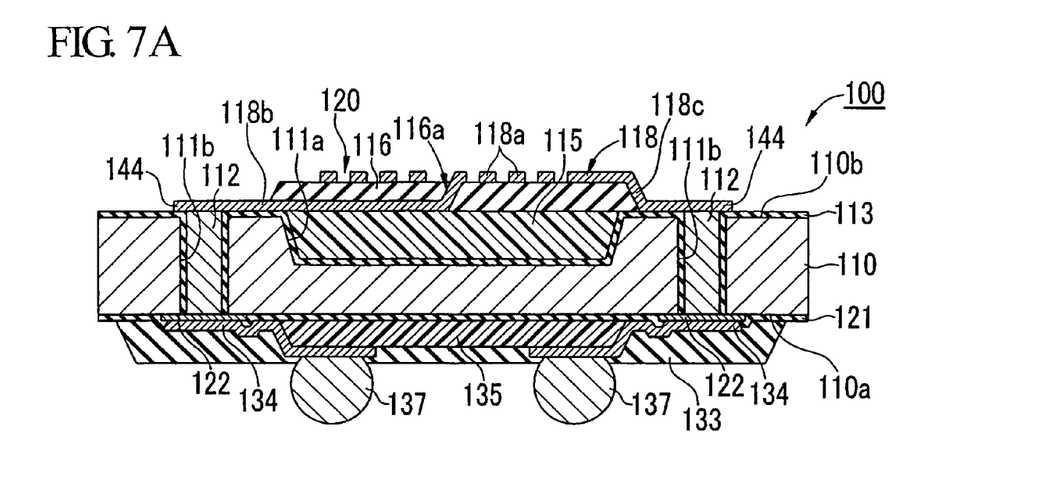
FIGS. 7A and 7B are views of a semiconductor device according to a fourth embodiment of the invention.
Figure 7B:
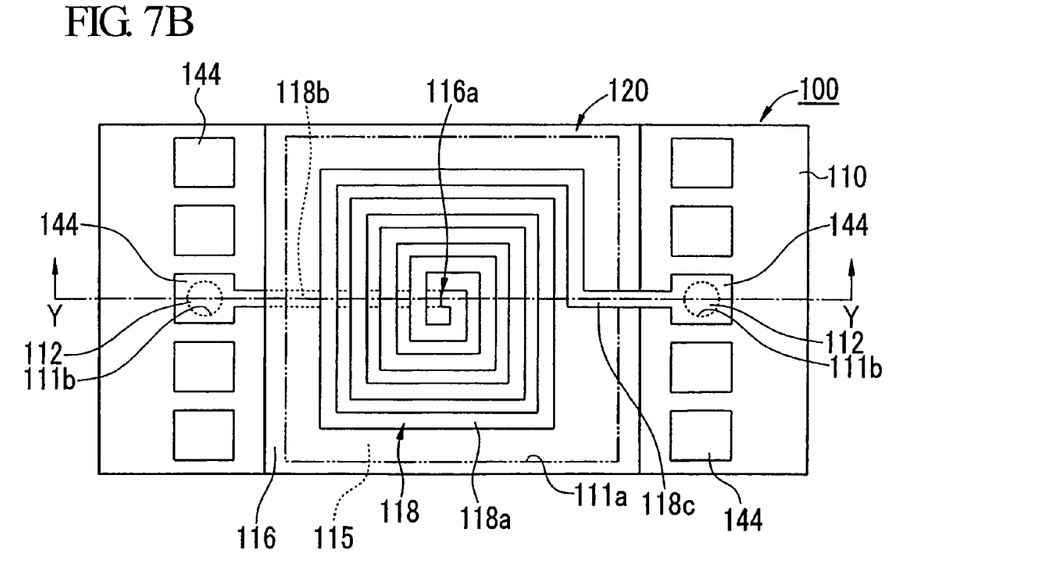

FIGS. 7A and 7B are diagrams of a semiconductor device according to this embodiment, FIG. 7A being a cross-sectional configuration diagram taken along the line Y-Y appended to the plan configuration diagram shown in FIG. 7B. A semiconductor device 100 of this embodiment shown in FIGS. 7A and 7B has a wafer level CSP (W-CSO) structure. FIGS. 8A to 8D are cross-sectional step diagrams of a manufacturing method of the semiconductor device shown in FIGS. 7A and 7B.

As shown in FIG. 7A, the semiconductor device 100 includes a silicon substrate (semiconductor substrate) 110, a wire section 120 provided on a first face 110b of the silicon substrate 110, this first face 10b being on a side opposite to a second face 110a which is the active face of the silicon substrate 110, and a plurality of (two in FIG. 7A) through-type electrodes 112 which pass through the silicon substrate 110. Passive electrodes and an integrated circuit including semiconductor elements such as memory elements and transistors are formed on the second face 110a. As shown in the plan configuration of FIG. 7B, the wire section 120 is provided approximately in the center of the first face 110b of the silicon substrate 110, and pads 144 are arranged on the left and right sides (as viewed in FIG. 7B) of the wire section 120.

As shown in FIG. 7A, an indented removed region 111a is formed in the first face 110b of the silicon substrate 110 by removing a part of the first face 110b in the thickness direction. The inner side of the removed region 111a is filled with an insulating material to form an insulating section 115, with an insulating film 113 provided therebetween. The top face (as viewed in FIG. 7A) of the insulating section 115 is flat, and the wire section 120 is provided on this flat face. The wire section 120 includes an insulating layer 116 formed on the insulating section 115, and a spiral inductor (wire) 118 provided in flat regions on the insulating layer 116.

The inductor 118 includes an inductor section 118a which forms a spiral pattern on the insulating layer 116, a first terminal wire section 118b which is conductively connected to one end of the inductor section 118a in a central section 116a of the insulating layer 116, and a second terminal wire section 118c which is connected to an end at a side opposite to the first terminal wire section 118b. The first terminal wire section 118b is formed on a wire layer between the insulating layer 116 and the insulating section 115. It is extracted toward the left side (as viewed in FIGS. 7A and 7B) from the central section 116a which forms a connection section with the inductor section 118a, and electrically connected to the pads 144 on the through-type electrodes 112. The second terminal wire section 118c is extracted toward the right side (as viewed in FIGS. 7A and 7B), and electrically connected to the pads 144 on the through-type electrodes 112.

The insulating section 115 and the insulating layer 116 can be formed using the same insulating material as the insulating section 12 and the insulating layer 22 according to the first embodiment described earlier. The material used in forming the inductor 118 is also the same as that of the inductor 21 according to the first embodiment.

Electrodes 122 are formed on the second face 110a of the silicon substrate 110 and correspond to the two through-type electrodes 112. The second face 110a is covered by a passivation film (insulating film) 121 which is formed such as to avoid the electrodes 112. A stress-relaxation layer 135 of an insulating resin material is formed such as to avoid the electrodes 122, which are exposed from openings in the passivation film 121. Redistribution wires 134 extend from above the electrodes 122 to above the stress-relaxation layer 135. A solder resist 133 covers the redistribution wires 134 and the stress-relaxation layer 135. Solder bumps 137 are formed over the redistribution wires 134, which are exposed in openings provided in the solder resist 133.

According to the semiconductor device 100 of this embodiment configured as described above, since the wire section 120 is formed on the first face 110b on the side opposite to the active face, it is possible to provide a semiconductor device which contains an inductor and an antenna on a single chip. Since the removed region 111a is also provided on the side opposite to the active face, and the wire section 120 is provided on the insulating section 115 formed in the removed region 111a, it is possible to realize a semiconductor device which contains an inductor and an antenna without changing the area of the chip package.

Furthermore in this embodiment, wires of the wire section 120 provided on the first face 110b are extracted via the through-type electrodes 112 to the second face 110a (active face) side, and are electrically connected via the redistribution wires 134 on the second face 110a to the bumps 137, which function as external connection terminals. Since this makes the semiconductor device suitable for flip-chip packaging, the wire section 120 which functions as an antenna or the like is positioned on the top face when the semiconductor device 100 is mounted on a substrate, obtaining a configuration which is effective in transmitting/receiving by antenna.

Furthermore in this embodiment, the effects of providing the insulating section 115 are the same as those in the previous embodiments. That is, since the spiral inductor 118 is provided on the insulating section 115 formed by filling the removed region 111a with an insulating material, generation of a magnetic field in the inductor section 118a when a current is supplied to the inductor 118 can be suppressed. Moreover, electromagnetic coupling between the inductor 118 and integrated circuits and the like formed on the second face (active face) 110a can be suppressed due to the insulating section 115 which is provided between them. This can also increase the Q-value of the inductor 118.

Manufacturing Method

Subsequently, a method of manufacturing the semiconductor device 100 will be explained with reference to FIGS. 8A to 8D.

While the manufacturing method of this embodiment actually forms a plurality of the semiconductor devices 100 on the same silicon wafer (silicon substrate) in a single operation, and then uses a dicing apparatus to dice (cut) them into individual pieces to obtain the semiconductor devices 100, in order to simplify the explanation, FIGS. 8A to 8D merely depict steps of manufacturing one semiconductor device 100.

Figure 8A:
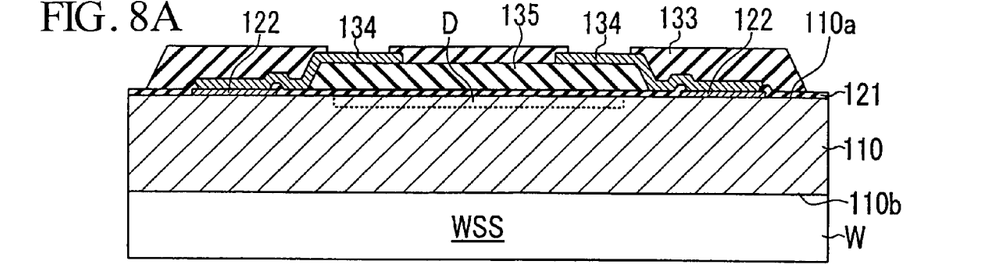
FIGS. 8A, 8B, 8C, and 8D are cross-sectional step diagrams of a method of manufacturing a semiconductor device.

Firstly, as shown in FIG. 8A, an integrated circuit D is formed on the second face 110a of the silicon substrate 110. The first face 110b side of the silicon substrate 110 is affixed to a glass plate (supporting plate) W using an adhesive agent which can be peeled away by irradiation of ultraviolet light (UV light). This glass plate W is part of what is termed a wafer support system (WSS), and, with the glass plate W affixed, the silicon substrate 110 can be processed as desired, such as by polishing, dry etching, or wet etching. Application of this type of support system with low peel-away force is remarkably effective in ensuring stability and reliability during fluid process steps of a silicon substrate which is already processed to a thin-plate.

The electrodes 122 are formed on the second face 110a of the silicon substrate 110, namely the active face (the face which the integrated circuit D is formed on). A passivation film 121 is formed on the silicon substrate 110 such as to cover the electrodes 122, and is patterned by conventional photolithography and etching methods to remove it from the tops of the electrodes 122 and expose them. In addition, the passivation film 121 and the electrodes 122 are covered with a resin layer (not shown).

The resin layer is patterned using conventional photolithography and etching methods, and a stress-relaxation layer 135 is formed in a predetermined shape, i.e. in a region on the silicon substrate 110 including the positions directly above the electrodes 122.

The redistribution wires 134 connecting to the electrodes 122 are then formed by patterning. For example, in forming the redistribution wires 134, conductive materials such as TiW and Cu are grown in that sequence by sputtering such that they become conductive with the electrodes 122 exposed on the passivation film 121. The conductive materials are patterned to wire shapes, and Cu is laminated onto the pattern.

The redistribution wires 134 are covered with a solder resist 133. Parts of the redistribution wires 134 positioned on the stress-relaxation layer 135 are removed using conventional photolithography and etching methods, exposing the redistribution wires 134 in these openings. When the above steps are completed, the silicon substrate 110 is peeled away from the glass plate W, and is supported as shown in FIG. 8B by affixing its second face 110a side to the glass plate W.

Figure 8B:
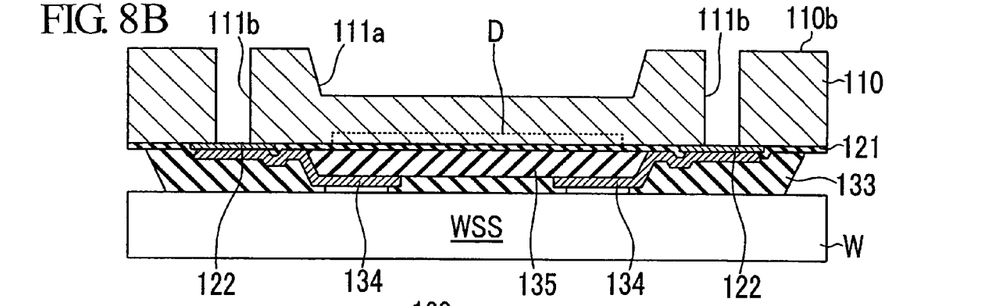

Using a photoresist, a mask (not shown) is formed on the first face 110b of the silicon substrate 110, and the silicon substrate 110 is removed by dry etching from the first face 110b side such that, as shown in FIG. 8B, an indented removed region 111a is formed in the first face 110b at a position corresponding to a rear face side of the integrated circuit D. In addition, through-holes 111b are formed such that they lead through the silicon substrate 110 to the electrodes 122.

In this step, there is no limitation on using a photoresist as the mask for patterning. For example, an $SiO_2$ film may be used as a hard mask, or a photoresist mask and a hard mask may be used together. The etching method is not limited to dry etching, it being acceptable to use wet etching, laser processing, or both of these.

Figure 8C:
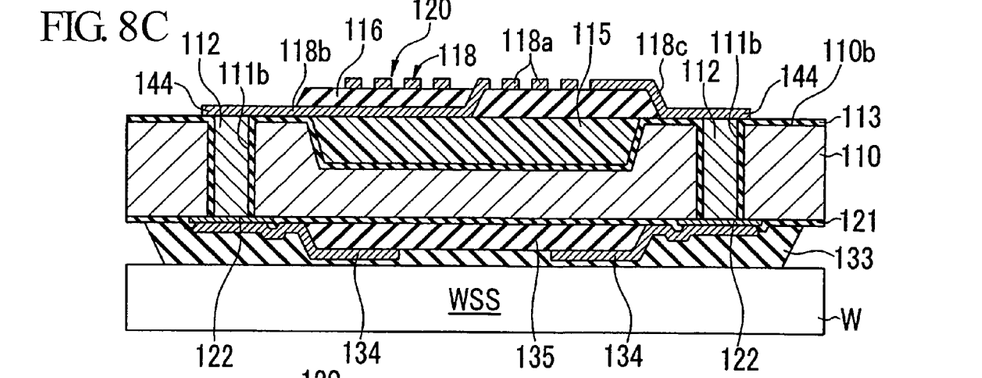
Figure 8D:
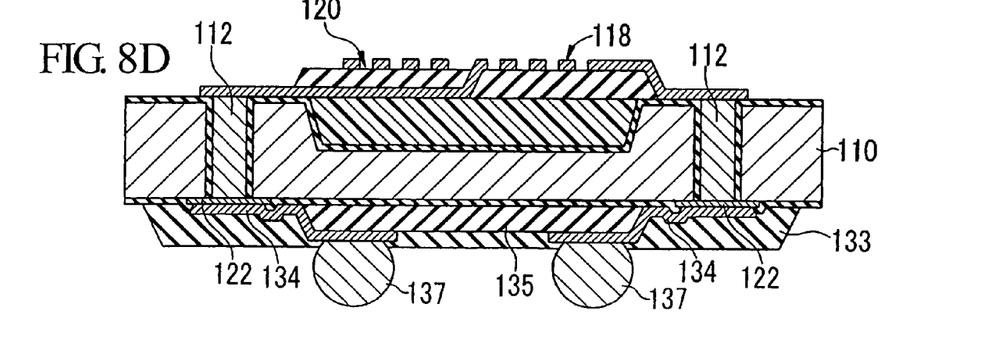

As shown in FIG. 8C, an insulating film 113 is formed over the first face 110b of the silicon substrate 110, the removed region 111a, and the inner walls of the through-holes 111b. The removed region 111a is provided in order to prevent problems such as current leaks, corrosion of the silicon substrate 110 caused by oxygen, water, and so on, and can be formed by using various types of CVD methods to grow a silicon oxide film. If the insulating film 113 need only have desired insulating characteristics and is not limited to silicon oxide; silicon nitride and resin materials may be used instead. To ensure conduction between the through-type electrodes 112 and the electrodes 122, the insulating film 113 on the rear face portions of the electrodes 122 (the portions facing the through-holes 111b) is removed by dry etching or laser processing, such that the insulating film 113 is formed only on the inside walls of the through-holes 111b.

The internal sections of the through-holes 111b are then plated using electrochemical plating (ECP). This plating process obtains a conductive material for forming the through-type electrodes 112 inside the through-holes 111b, and electrically connects the through-type electrodes 112 to the electrodes 122 which are exposed at the bottoms of the through-holes 111b. A conductive material such as copper (Cu) can be used to form the through-type electrodes 112. An actual step of forming the through-type electrodes 112 includes, for example, a step of laminating a TiN film (or a TiW film) and a Cu film by sputtering, and a step of forming the Cu by plating. The method of forming the through-type electrodes 112 is not limited to plating as mentioned above, and they can formed by embedding a conductive paste, a molten metal, metal wires, etc.

While in this embodiment, the through-type electrodes 112 are embedded by filling the through-holes 111b with a conductive material, they need not be completely embedded. It is acceptable if they are formed at least along the inner walls of the through-holes 111b in the thickness direction of the substrate, and electrically connected to the electrodes 122 on the second face 110a side.

After forming the through-type electrodes 112, the removed region 111a of the first face 110b of the silicon substrate 110 is filled with an insulating material such as a resin material using droplet discharge and spin-coating methods to form the insulating section 115. At this time, the top face (as viewed in FIG. 8C) of the insulating section 115 is made flat. Any insulating material that sticks to the through-type electrodes 112, other terminals, and such like when forming the insulating section 115 is removed as appropriate.

A metal film such as Au, Cu, Ag, Ti is then formed by sputtering and the like on the first face 110b where the insulating section 115 is formed, and is patterned to a desired shape using conventional photolithography and etching methods to form the pads 144 and the first terminal wire section 118b shown in FIGS. 7A and 7B.

A method such as spin-coating is used to paste an insulating material, such as a photosensitive resin material, over the first face 110b where the first terminal wire section 118b and the pads 144 are formed. This insulating material is patterned to a desired shape using conventional photolithography and etching methods to selectively form the insulating layer 116 shown in FIG. 8C on the silicon substrate 110. Through-holes, for electrically connecting the first terminal wire section 118b arranged at the bottom layer of the insulating layer 116 to the inductor section 118a formed above the insulating layer 116 in a later step, are formed in the insulating layer 116 at this time.

The flat inductor section 118a shown in FIG. 7B is formed on the insulating layer 116. The steps of forming the inductor section 118a can include, for example, a step of forming a Cu film by sputtering on the silicon substrate 110 including the top of the insulating layer 116, a step of patterning a plated resist having an opening corresponding to the flat shape of the inductor section 118a, a step of selectively plating a layer of Cu on the Cu film using the plated resist as a mask, and a step of, after removing the plated resist, removing the exposed Cu film by a method such as dry etching. This formation method obtains the inductor section 118*a* having a laminated structure of the Cu film and the plated layer. Alternatively, a method of selectively forming wires using droplet discharge and the like can be applied.

Bumps 137 of Pb-free solder or the like are then mounted on the redistribution wires 134 which are exposed on the solder resist 133 provided on the second face 110*a* side of the silicon substrate 110. When providing these solder bumps 137, solder balls may be mounted on the redistribution wires 134 or a solder paste may be printed over them.

Individual semiconductor devices 100 are obtained by dicing with a dicing apparatus. This enables a plurality of the semiconductor devices 100 to be formed almost simultaneously on the silicon substrate 110. Thereafter, the silicon substrate 110 is cut for each semiconductor device 100 to obtain the semiconductor device 100 shown in FIGS. 7A and 7B.

As described in detail above according to the manufacturing method of this embodiment, the semiconductor device 100 can be manufactured efficiently and its cost can be reduced.

The technological scope of the invention is not limited to the above embodiments, and various modifications can be made without departing from the spirit of the invention.

Figure 6:
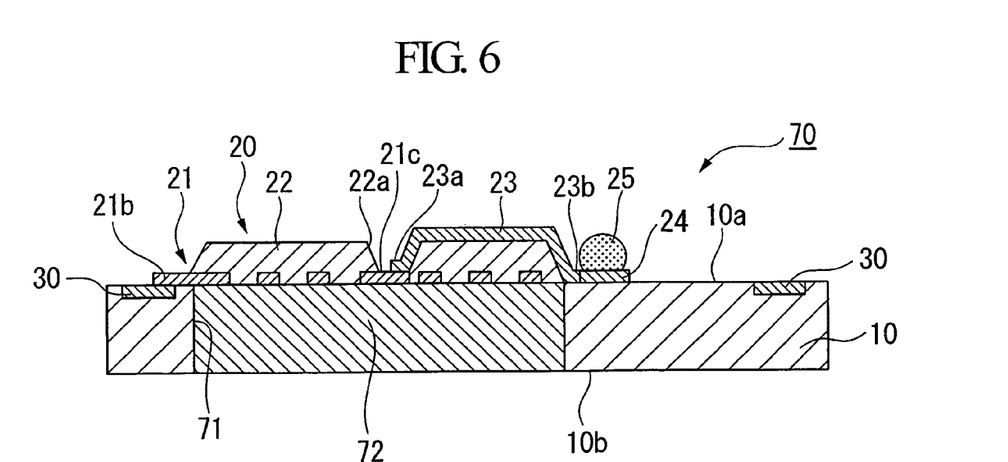
FIG. 6 is a cross-sectional view of a modification of the semiconductor device according to the embodiments of the invention.

For example, in each of the embodiments described above, the removed region need only be formed in at least part of a region in the thickness direction of the silicon substrate 10 corresponding to the inductors 21 and 61. That is, as shown in FIG. 6, a removed region 71 may pass through the silicon substrate 10 from one face 10*a* to another face 10*b*.

In this configuration, due to the formation of the removed region 71, all regions in the thickness direction of the silicon substrate 10 corresponding to the inductor 21 are filled with the insulating material to form an insulating section 72. Therefore, electromagnetic coupling between the inductor 21 and circuits and the like formed on the silicon substrate 10 can be suppressed to a minimum.

To electrically connect the other end 21*c* of the inductor 21 to one end 23*a* of the leading line 23, the inside of the through-hole 22*a* may be plated using electrochemical plating (ECP), or a conductive paste, a molten metal, a metal wire, or the like, may be embedded in the through-hole 22*a*.

What is claimed is:

1. A semiconductor device, comprising:
   a semiconductor substrate having a first face in which a hole is formed;
   an insulating section made of an insulating material accommodated in the hole;
   a stress-relaxation layer formed by an insulating resin material on the wire;
   a wire having a turning pattern and arranged on the insulating section and wherein the hole has an edge extending along an outermost turn of the wire.

2. The semiconductor device according to claim 1, wherein the wire has a spiral pattern that has multiple turns on the insulating section.

3. The semiconductor device according to claims 1, wherein a depth of the hole is equal to or more than 5 µm.

4. The semiconductor device according to claim 1, wherein a relative permittivity of the insulating material is equal to or less than 10.

5. The semiconductor device according to claim 1, wherein the hole has a substantially rectangular opening.

6. The semiconductor device according to claim 1, wherein the wire has a substantially rectangular-shaped spiral inductor which is formed over the insulating section, and the hole has a substantially rectangular-shaped opening.

7. The semiconductor device according to claim 6, wherein the spiral inductor has a shape that is substantially similar to a shape of the opening of the hole.

\* \* \* \* \*